United States Patent

Nakajima et al.

[11] Patent Number: 5,821,597
[45] Date of Patent: Oct. 13, 1998

[54] PHOTOELECTRIC CONVERSION DEVICE

[75] Inventors: Setsuo Nakajima; Yasuyuki Arai; Hisato Shinohara, all of Kanagawa; Masayoshi Abe, Tokyo, all of Japan

[73] Assignees: Semiconductor Energy Laboratory Co., Ltd., Kanagawa-ken; TDK Corporation, Chou-ku, both of Japan

[21] Appl. No.: 554,241

[22] Filed: Nov. 8, 1995

Related U.S. Application Data

[62] Division of Ser. No. 118,672, Sep. 10, 1993, abandoned.

[30] Foreign Application Priority Data

| Sep. 11, 1992 | [JP] | Japan | 4-269696 |
| Sep. 11, 1992 | [JP] | Japan | 4-269697 |

[51] Int. Cl.$^6$ ............... H01L 31/075; H01L 31/105; H01L 31/117; H01L 23/04
[52] U.S. Cl. ............ 257/458; 257/433; 257/656; 257/668; 257/698
[58] Field of Search .................. 257/433, 668, 257/698, 458, 656

[56] References Cited

U.S. PATENT DOCUMENTS

| 4,400,409 | 8/1983 | Izu et al. | 437/173 |
| 4,410,558 | 10/1983 | Izu et al. | 437/2 |
| 4,582,720 | 4/1986 | Yamazaki | 427/573 |
| 4,601,260 | 7/1986 | Ovshinsky | 118/718 |
| 4,922,376 | 5/1990 | Pommer et al. | 257/668 |
| 5,293,067 | 3/1994 | Thompson et al. | 257/668 |
| 5,296,043 | 3/1994 | Kawakami et al. | 437/2 |
| 5,306,925 | 4/1994 | Abe et al. | 257/458 |

FOREIGN PATENT DOCUMENTS

| 55-13939 | 1/1980 | Japan | 136/255 |
| 56-71931 | 6/1981 | Japan | 136/258 AM |
| 436449 | 6/1992 | Japan | 118/723 |

OTHER PUBLICATIONS

Technical Digest of the International PVSEC-3, Tokyo, Japan, 1987 "A Monolithic Series-Connected a-Si-:H Solar Cell on an Organic Polymer Film" pp. 391-394, K. Nakatani, K. Suzuki, H. Okaniwa.

Sharp Technical Report Vo. 33, pp. 121-124 "Thickness Measurement and Control of Amorphous Silicon Thin Films", Toshihiko Hirobe et al.

18th IEEE PVSC (1985) pp. 1523-1528 "Mass Production Technology In A Roll-To-Roll Amorphous Silicon Solar Cell Process", H. Horimoto et al.

Technical Digest PVSEC-1 pp. 577-582; "Roll-To-Roll Mass Production Process for a-Si Solar Cell Fabrication" Stanford R. Ovshinsky.

*Primary Examiner*—Teresa M. Arroyo
*Attorney, Agent, or Firm*—Sixbey, Friedman, Leedom & Ferguson; Gerald J. Ferguson, Jr.; Eric J. Robinson

[57] ABSTRACT

A photoelectric conversion device taking the form of a thin film and having a substrate exhibiting poor thermal resistance. The device prevents thermal deformation which would normally be caused by local application of excessive heat to the substrate. The device has output terminals permitting the output from the device to be taken out. The output terminals are formed on the surface of the substrate opposite to the photoelectric conversion device. The device further includes electrical connector portions for electrically connecting the electrodes of the device with the output terminals. The present invention also provides a method of treating a substrate having poor thermal resistance with a plasma with a high throughput. The substrate is continuously supplied into a reaction chamber and treated with a plasma. This supply operation is carried out in such a way that the total length of the substrate existing in a plasma processing region formed by electrodes is longer than the length of the electrodes.

13 Claims, 9 Drawing Sheets

PHOTOELECTRIC CONVERSION DEVICE

This is a Divisional application of Ser. No. 08/118,672, filed Sep. 10, 1993, abandoned.

FIELD OF THE INVENTION

The present invention relates to a photoelectric conversion device having a novel structure and, more particularly, to a photoelectric conversion device employing a flexible substrate having poor thermal resistance. Also, the invention relates to processing of this flexible substrate such as formation of a coating on the substrate and, more particularly, to a method of treating the flexible substrate with a plasma when a solar cell or the like is fabricated by the use of a flexible organic film instead of a solid substrate.

BACKGROUND OF THE INVENTION

The market has required smaller, thinner, and even lighter electronic and electric parts. Various materials have begun to be used to fabricate these parts.

Photoelectric conversion devices such as solar cells also show such a tendency, and devices of various specifications have been proposed. Among others, thin and light devices using a substrate made of a flexible organic or metal film have attracted attention because of the possibility of application to other electrical appliances and industrial machines.

Of photoelectric conversion devices using these flexible substrates, photoelectric conversion devices employing substrates made of organic materials have attracted attention because of their cost, characteristics, and workability. Photoelectric conversion devices of this type have begun to become the mainstream of photoelectric conversion devices having flexible substrates. Flexible substrates made of organic materials have numerous advantages of having high workability and being light in weight over substrates made of thin metal materials.

The structure of a photoelectric conversion device using a flexible substrate made of such an organic material is diagrammatically shown in FIG. 7, where three photoelectric elements are connected in series on a flexible substrate 1 to form an integrated photoelectric conversion device. Each of the photoelectric elements comprises a first electrode 71, a semiconductor layer 72 consisting of a non-single crystal, and second electrodes 73, 74. In this example, light impinges on the second electrodes. Therefore, one second electrode 73 is made of an ITO that is a transparent electrode material. The other second electrodes 74 are grid-like auxiliary electrodes. The second electrodes 74 are connected with the first electrodes 71 of adjacent photoelectric conversion elements. The elements are connected in series. The output from this photoelectric conversion device is developed between copper leads 75 which are soldered to the second electrodes.

Substrates having poor thermal resistance such as the aforementioned flexible substrates made of organic materials are not sufficiently resistant to heat compared with substrates made of other materials. Polyimide film which is said to be resistant to heat can withstand high temperatures of about 300° to 350° C. at best. For this reason, when photoelectric conversion devices are manufactured, application of heat is avoided as fully as possible. This method has been put into practical use.

However, after a photoelectric conversion device is fabricated, output leads must be provided to permit the use of the device. The output leads are connected with the second electrodes normally by soldering. To fuse the solder, it is necessary to apply heat locally.

Consequently, excessive heat is applied to only a part of the organic material of the flexible substrate. As a result, only this part deforms thermally. If the leads are bonded to the electrodes of the photoelectric conversion device at a temperature at which no thermal deformation takes place, then a sufficient bonding strength cannot be obtained. Under this condition, the electrical conduction deteriorates, or the bonded portions peel off, thus impairing the reliability. Hence, it is desired to improve these output leads.

Where a photoelectric conversion device is fabricated from such a flexible material by the prior art techniques, handling of the substrate has posed problems. Especially, where a semiconductor coating or the like is formed by chemical vapor deposition or other similar method, the flexibility of the substrate presents problems. Therefore, when such a substrate is used, the production facility has been required to have a special means for holding the substrate, unlike the case in which other solid substrates are employed.

A so-called roll-to-roll method has been generally accepted as a method of holding the substrate. This method begins with pulling out a flexible substrate from a roll. The substrate is fed into a plasma processing apparatus or plasma processing chamber, where the substrate is processed. Then, the substrate is rewound into a roll.

In the case of a plasma processing machine making use of the conventional roll-to-roll method, a substrate is placed substantially parallel to electric discharge electrodes located in a region where plasma processing is performed. The substrate is slowly and continuously supplied from the roll and passed through the processing region to treat the substrate with a plasma.

One example of this machine is disclosed in Japanese Patent Laid-Open No. 34668/1984. This disclosed machine is designed to form a film. The reaction chamber of this machine and its vicinities are schematically shown in FIG. 9, where a flexible substrate 201 is wound into a roll 220. The substrate is continuously fed into the reaction chamber, 221, from the roll 220. A pair of parallel-plate electrodes 222, 223, a reactive gas supply system 225, and an exhaust system 226 are mounted inside the reaction chamber 221. The continuous flexible substrate 201 passes over or by the cathode of the parallel-plate electrodes substantially parallel to them. In this structure, a film is formed on the substrate. The substrate may also be positioned on the side of the anode and processed. The substrate 201 supplied in this way is treated with a plasma while passing through the processing region close to the electrodes. That is, the substrate is treated with a plasma or a film is formed while the substrate stays in the processing region.

In the known plasma processing machine described above, a set of discharge electrodes can treat only one roll of substrate. Hence, the throughput of the plasma processing is low. In the case of silicon of a non-single crystal used for photoelectric conversion device, a film is grown at a rate within a range from 0.1 to 10 Å/sec to secure the required semiconductor characteristics, i.e., to prevent the film quality from deteriorating. It is usually necessary that a semiconductor film of a photoelectric conversion device have a thickness of about 0.3 to 2 μm. Therefore, the substrate must stay in the processing region for a long time. In consequence, the plasma processing region, or the electrodes, must be made long, or the substrate must be passed through the region at a quite low speed.

Where the electrodes are made long, the dimensions of the reaction chamber are increased. That is, the plasma processing machine occupies a large area. This is a heavy burden on mass production. If the substrate conveyance speed is decreased, the throughput of the plasma processing drops, thus hindering mass production. More specifically, in the case of the above-described semiconductor consisting of a non-single crystal, if a film 1 μm thick should be formed within a reaction chamber about 1 m long at a deposition rate of 1 Å/sec, then the substrate is transported at 0.1 mm/sec. If a roll having a length of 100 m is treated, as long as about 278 hours are required.

Consequently, there is a demand for a machine which relies on the roll-to-roll method and treats substrates at a higher speed or improves the throughput of the machine. Whether electronic devices using flexible substrates can be mass-produced or not depends heavily on this point.

SUMMARY OF THE INVENTION

The present invention resides in a photoelectric conversion device which takes the form of a thin film and is formed on a substrate having poor thermal resistance e.g. an organic resin substrate. The device has output terminals to permit the output from the device to be taken out. The output terminals are mounted on an opposite surface of said substrate to the surface of the substrate on which the device is formed. The photoelectric conversion device further includes electrical connector portions (conductors) for electrically connecting the output terminals with the electrodes of the device.

In one feature of the invention, the substrate of the photoelectric conversion device described just above is flexible, and the electrical connector portions are located in holes (openings) formed in the flexible substrate.

In another feature of the invention, the substrate of the photoelectric conversion device described just above is flexible, and the electrical connector portions are located at end surfaces of the flexible substrate, that is, the electrical connector portions are provided on sides of the flexible substrate.

Also, the present invention resides in a photoelectric conversion device which takes the form of a thin film, is formed on a substrate having poor thermal resistance, and has output terminals and electrical connector portions. The output terminals permit the output from the device to be taken out, and are mounted on a surface opposite to the surface of the substrate on which the device is formed. The electrical connector portions electrically connect the electrodes of the device with the output terminals, and are made of the same material as portions of the electrodes of the device.

In any of the novel photoelectric conversion devices described above, output leads are provided to permit the output from the photoelectric conversion device to be taken out. When the device is provided with the output leads, the leads are bonded to the device independent of electrical connection of the leads with the electrodes of the device. Thus, a sufficient bonding strength is accomplished without applying high temperature locally. Therefore, the output terminals are mounted on the surface of the substrate opposite to the photoelectric conversion device. The output terminals are bonded to the substrate. The bonded output terminals are electrically connected with the electrodes of the device by an electrically conductive material. In this way, the output terminals having sufficient bonding strength can be mounted without applying excessive heat to the substrate which has poor heat resistance.

The present invention is also intended to solve the aforementioned problems. It is an object of the invention to provide a method of treating flexible substrates with a plasma with a high productivity. In order to treat the flexible substrate with a plasma, the substrate is continuously supplied into a reaction chamber in such a way that the total length of the substrate existing in a plasma processing region formed by electrodes is longer than the length of these electrodes.

A plasma processing method in accordance with the present invention comprises the steps of:

exposing a substrate to a plasma generated adjacent to an electrode provided in a chamber (or a plasma generated adjacent to an electrode and enclosed within a frame structure provided in a chamber) in order to perform a plasma processing on said substrate; and conveying said substrate during said plasma processing, wherein length of said substrate in said plasma is longer than that of said electrode. Said substrate can be moved from a roll to another roll.

One example of method of supplying the flexible substrate in such a way that the total length of the substrate existing in a plasma processing region formed by electrodes is longer than the length of these electrodes is illustrated in FIG. 8, where the flexible substrate, 201, is made to take a zigzag course within the plasma processing region, 204, between a pair of electrodes 202 and 203 by rollers such as 205. In this case, the total length of the flexible substrate 201 existing inside the plasma processing region is increased as the number of turns is increased.

The conventional method utilizing the prior art roll-to-roll scheme as typically shown in FIG. 9 makes use of the dark portion close to the cathode or anode for plasma processing. On the other hand, the present invention makes positive use of a positive column produced by a plasma discharge, thus improving the productivity of the plasma processing. In FIG. 8, the flexible substrate is supplied substantially perpendicular to the surfaces of the discharge electrodes 202 and 203. The direction of supply is not limited to this direction. Similar advantages can be obtained by supplying the substrate parallel or at an angle to the surfaces of the electrodes as long as the total length of the substrate staying in the plasma processing region is longer.

Where a coating is formed by plasma processing, the surface of the substrate is preferably parallel to the direction of gravity. In particular, when a coating is formed, dust and flakes are produced. Therefore, if the surface of the substrate is parallel to the direction of gravity, then the dust and flakes are prevented from depositing onto the substrate. Hence, the surface of the substrate can be made clean. Also in this case, the angular relation between the substrate surface and the electrode surface can be set at will.

The novel method of treating a flexible substrate with a plasma makes use of a positive column more positively in the manner described now. A plasma discharge region is established which has such a frame structure as to confine a plasma discharge within a reaction chamber where plasma processing is performed. The substrate is continuously supplied into the frame structure so that the substrate takes a zigzag course. In consequence, a high productivity can be achieved. Especially, this structure can make the plasma discharge region uniform and hence can realize homogeneous plasma processing.

Since the novel method makes positive use of an electric discharge in a positive column, two rolls of substrate can be supplied in a back-to-back relation into the plasma processing region. In this case, the throughput can be doubled exactly. However, it is necessary to hold the surfaces of the substrates by rollers or the like in order that each substrate take a zigzag route. For this purpose, the surface of each substrate is not totally held but rather partially supported.

The total length of plural substrates existing in the plasma processing region can be made longer than the electrodes by supplying the substrates parallel to the electrodes without taking a zigzag course. In this case, numerous facilities for supplying the substrates are necessary but this method has the advantage that the rolls do not directly touch the substrate surfaces.

Other objects and features of the invention will appear in the course of the description thereof, which follows.

DESCRIPTION OF THE PREFERRED EMBODIMENTS OF INVENTION

Example 1

Figure 1A:
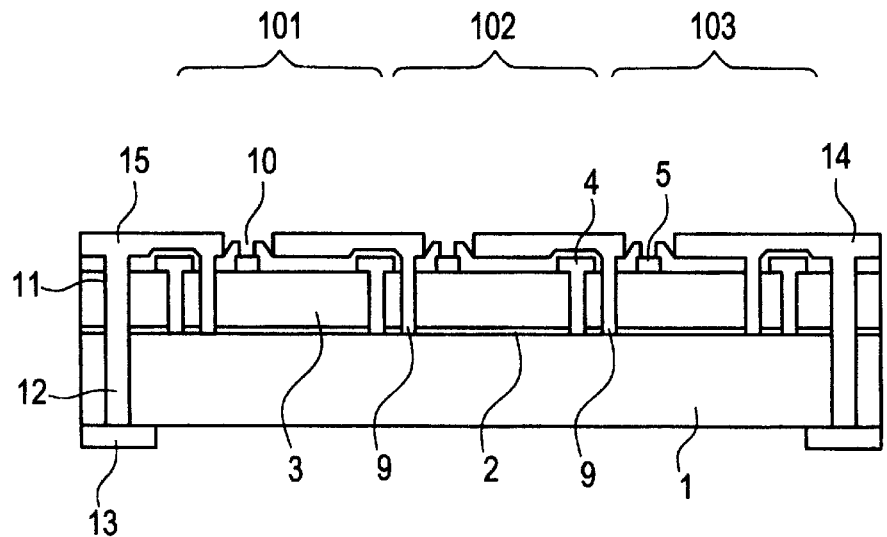
FIGS. 1(A)–1(C) are schematic cross sections of a photoelectric conversion device according to the invention.

FIG. 1(A) shows an integrated photoelectric conversion device according to the invention. This photoelectric conversion device is composed of a flexible substrate 1 made of plastic film, a first electrode 2, a PIN-type photoelectric conversion layer 3, second electrodes 6, 7, and insulators 4, 5. The insulators 4 and 5 consist of epoxy resin.

The photoelectric conversion device has photoelectric elements 101, 102, and 103. The second electrode 7 of the photoelectric element 101 is electrically connected with the first electrode 2 of the photoelectric element 102 by a connector portion 9. The device is provided with a first groove 8 to isolate the first electrode of the first photoelectric element from the photoelectric conversion layer of the second photoelectric element 102. The second electrodes 6 of these elements 101 and 102 are insulated from each other by a groove 10 formed by a laser scriber.

Simultaneously with formation of the second electrode 7 for obtaining an integrated structure, the output of the photoelectric element 101 on the side of the substrate is brought out onto the photoelectric conversion layer and connected with an outgoing electrode 15. The output of the second electrode of the photoelectric element 103 is connected with an outgoing electrode 14 extending from the second electrode 7.

In the present example of photoelectric conversion device, a connector hole (opening) 11 has a connector portion 12 and extends through both photoelectric conversion layer and substrate which underlie the outgoing electrodes 14 and 15. These outgoing electrodes 14 and 15 are connected with output terminals 13 formed on the back surface of the device via the connector portion 12. This connector portion 12 is made of the same material as the second electrode 7. Thus, the output from the present photoelectric conversion device can be taken out from the output terminals 13 formed on the opposite surface of the substrate 1 to a surface on which the photoelectric elements are provided.

A method of fabricating the present example of photoelectric conversion device is described below by referring to FIG. 2 and ensuing figures. First, chromium was sputtered on the flexible substrate 1 to form the first electrode 2 having a thickness of 2000 Å. The substrate 1 was made of plastic film. In the present example, the plastic film consists of polyethylene terephthalate.

To form the chromium film, a DC magnetran sputtering machine was employed under the following conditions:

Partial pressure of argon: $6 \times 10^{-3}$ torr

DC current: 1 A

Substrate temperature: The substrate was not heated.

Then, the photoelectric conversion layer 3 was fabricated from silicon consisting of a non-single crystal. No restrictions are imposed on the photoelectric conversion layer. However, when the thermal resistance of the plastic film substrate is taken into account, it is desired to adopt a method which permits the substrate temperature to be set below 100° C.

In the present example, silicon semiconductor layers of N-type, I-type, and P-type were deposited successively in this order from the side of the substrate to form a PIN-type photoelectric conversion layer having a thickness of 4500 Å as the photoelectric conversion layer 3. None of these silicon semiconductor layers were made of a single crystal. Plasma-assisted CVD was used for this purpose and carried out under the following conditions:

(1) The N-type semiconductor layer having a thickness of 400 Å was formed under the following conditions:

Substrate temperature: 80° C.

RF power: 10 W (13.56 MHz)

Pressure during deposition process: 0.04 torr

Gas flow rates: $SiH_4$=15 sccm (containing 1% $PH_3$)

$H_2$=150 sccm (2) The I-type semiconductor layer having a thickness of 4000 Å was formed under the following conditions:

Substrate temperature: 80° C.

RF power: 10 W (13.56 MHz)

Pressure during deposition process: 0.04 torr

Gas flow rates: $SiH_4$=15 sccm $H_2$=150 sccm (3) The P-type semiconductor layer having a thickness of 100 Å was formed under the following conditions:

Substrate temperature: 80° C.

RF power: 10 W (13.56 MHz)

Pressure during deposition process: 0.04 torr

Gas flow rates: $SiH_4$=16 sccm (containing 1% $B_2H_6$)

$CH_4$=18 sccm $H_2$=145 sccm

Figure 2:
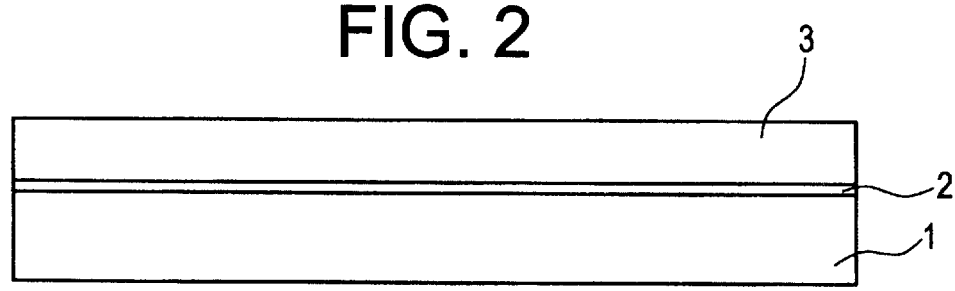
FIGS. 2–6 are cross sections of a photoelectric conversion device according to the invention, illustrating successive steps performed to fabricate the device.

After the condition illustrated in FIG. 2 was obtained, four first grooves 8 were formed by a laser scriber in a laminate consisting of the first electrode 2 and the photoelectric conversion layer 3. The scriber used a KrF excimer laser emitting a wavelength of 248 nm. To cut the first grooves, the laser emitted 7 shots of laser radiation, each having an energy of 1.0 J/cm$^2$.

In the present example, the laser beam was transformed into a linear form by optics, and each one shot produced a linear groove. Alternatively, a laser beam spot may be swept along a straight line to cut each groove.

An ArF excimer laser, an XeF excimer laser, a YAG laser, or the like can be used, depending on the application, for the laser scriber. As mentioned previously, the wavelength of the laser is preferably shorter than 600 nm. However, a YAG laser emitting a wavelength of 1.06 μm can also be used.

Importantly, the laminate consisting of the first electrode 2 and the photoelectric conversion layer 3 is scribed, unlike in the prior art techniques. Therefore, during laser scribing of the first electrode, occurrence of peeling from the plastic film substrate, fine splits, and flakes can be suppressed greatly.

Figure 3:
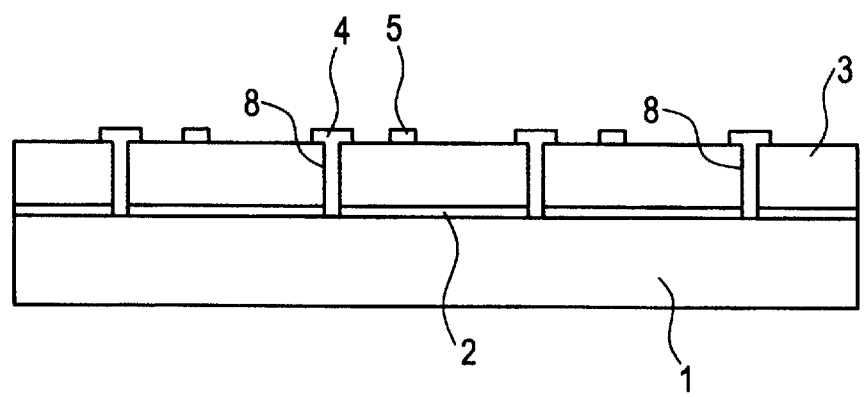

Then, as shown in FIG. 3, epoxy resin (an insulator) was printed to a thickness of 2 to 20 μm at given locations 4 and 5 by screen printing. In this way, the first grooves 8 were filled with the epoxy resin 4 that is an insulator. At the same time, the layer 5 of the insulator, or epoxy resin, was formed on the photoelectric conversion layer 3. The use of screen printing permits the insulator layers 4 and 5 to be simultaneously formed. This simplifies the patterning step which would normally often cause defects. Furthermore, in the novel method, the patterning step is done simply to process the insulator and so the suppression of defects in the insulator in the patterning step using screen printing contributes greatly to an improvement in the production yield.

In the present example, epoxy resin was used as an insulator because it can be easily processed. As long as an insulator is used, no restrictions are imposed on the material. Examples include silicon oxide, organic resins such as polyimide and silicone rubber, urethane, and acrylic resin. Since the material is irradiated with laser radiation in the subsequent laser scribing step, the material has preferably such thermal resistance that it neither burns out nor sublimes when exposed to weak laser radiation. Materials which totally transmit the laser radiation are not desirable.

Figure 4:
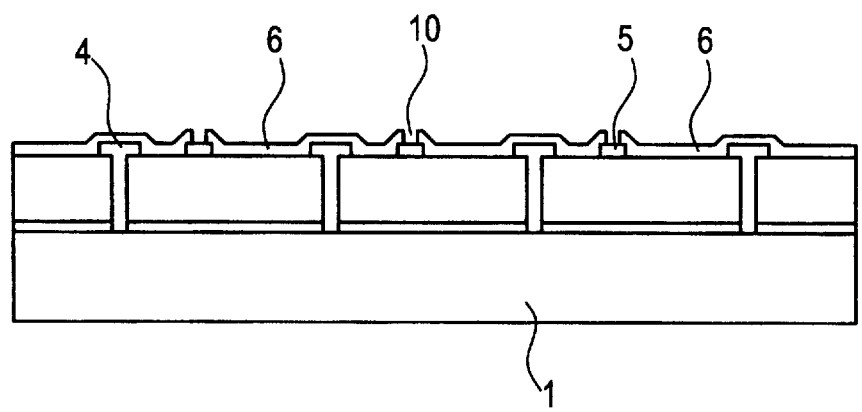

In this manner, the condition illustrated in FIG. 4 was obtained. The actual positions of the grooves 8 and the insulators 4 and 5 are determined by the accuracies of the patterning step (the screen printing in the present example) and of the laser scribing step. Obviously, these positions are not limited to the illustrated geometrical relation.

After deriving the condition shown in FIG. 4, the second electrodes 6 were deposited as a 2000 Å-thick layer by vacuum evaporation. The second electrodes 6 were made of ITO. Any other material such as $SnO_2$ or ZnO can be used as long as it transmits light. Also, various methods can be exploited to form the second electrodes. Where a plastic film substrate having poor thermal resistance is used as in the present example, a low-temperature process which does not thermally affect the substrate is preferably employed.

Grooves 10 were formed in the second electrodes 6 formed on the insulator layer 5 by laser scribing to cut the second electrodes 6 as shown in FIG. 4. Importantly, the insulator layer 5 shields the photoelectric conversion layer 3 against the laser radiation. In the past, in a laser scribing step for cutting only this transparent conductive film, the underlying photoelectric conversion layer 3 and the first electrode 2 have been often machined simultaneously. In this case, these two layers together form an alloy, thus producing a short circuit. This has made it difficult to pack numerous elements into an integrated circuit. On the other hand, in the present invention, the insulator layer 5 protects the underlying layer 3 against the laser radiation. Consequently, the insulator layer 5 prevents the laser beam from scribing the photoelectric conversion layer 3. In addition, this assures that the rear electrode is cut. Hence, quite high reproducibility and improved production yield can be obtained.

Thereafter, connector holes 11 were cut by a laser beam around the photoelectric elements in such a way that the holes 11 extended through the second electrodes 6, the photoelectric conversion layer 3, the first electrode 2, and the substrate 1. Since the holes 11 extended through the substrate, it had to be left to such an extent that it can be held. In the present example, the connector holes were formed by the use of a YAG laser in such a manner that the total area of the connector holes accounted for 30% of the area of the surrounding conducting region.

Copper sheets 13 were bonded with an epoxy resin to the surface of the substrate opposite to the surface having the connector holes. As a result, the portions excluding the connector holes were firmly bonded.

A grid-like auxiliary electrode 7 was then formed on the second electrodes 6 such that the electrode 7 forms portions of the second electrodes 6. The auxiliary electrode 7 was shaped like a comb on the light-receiving surface and shaped like rods substantially over one whole surface at locations where adjacent elements are connected together.

Figure 5:
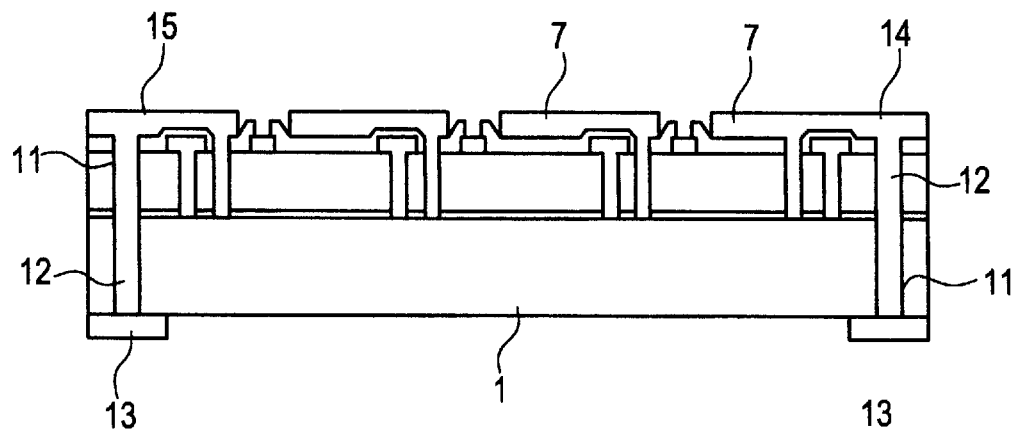
Figure 6:
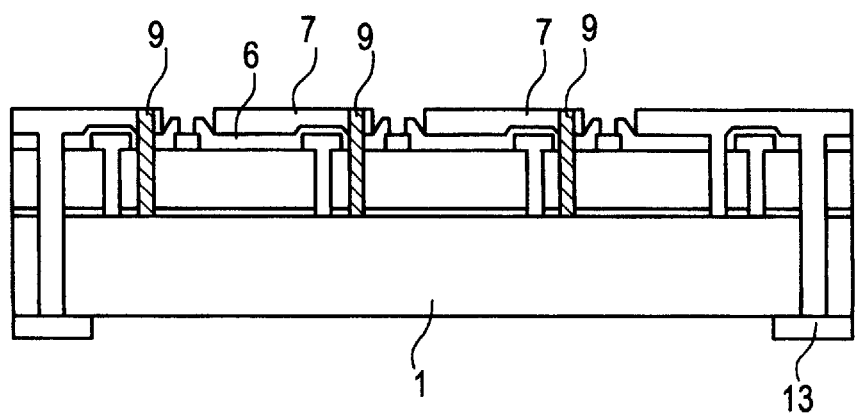
Figure 7:
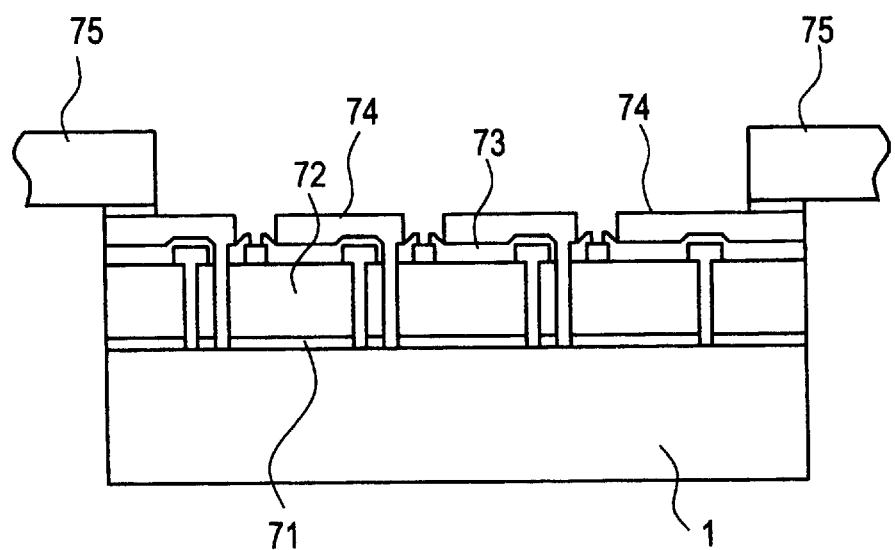
FIG. 7 is a schematic cross section of a known photoelectric conversion device.

The pattern of the auxiliary electrode 7 was improved and formed up to the vicinities of the connector holes 11 around the photoelectric elements to form outgoing electrodes 14 and 15. This auxiliary electrode 7 was patterned with silver paste by screen printing. In this manner, connector portions 12 were formed. Thus, the state shown in FIG. 5 was obtained.

This auxiliary electrode 7 was thermally treated at 100° C. for 50 minutes and sintered to complete the auxiliary electrode 7 and to form the connector portions 12. This permits the output from the photoelectric conversion device from being taken out from the output terminals 13 mounted at the rear surface of the substrate.

Then, the second electrodes 6 and 7 on which the auxiliary electrode 7 was formed were connected with the first electrode of adjacent photoelectric elements. For this purpose, a YAG laser beam was illuminated from the side of the second electrodes 6 and 7 to melt and diffuse the material of the second electrodes. The second electrodes passed through the semiconductor layer 3 and connected with the first electrodes. The wavelength of the YAG laser was 1.06 μm. The oscillation frequency of the Q switch of the laser was 2 KHz. The energy was 0.2 W. The electrically connected portions were scanned at a speed of 10 mm/sec to form junctions 9 at which the second electrodes 6 and 7 were connected with the first electrodes 2. In this way, the present example of photoelectric conversion device was completed by the steps described thus far.

This structure permits the output terminals 13 of the photoelectric conversion device to be directly bonded to the substrate via a strong adhesive. Hence, a sufficient adhesive strength could be obtained. Furthermore, a sufficiently good connection with the electrodes could be made by Ag paste. The output terminals of the photoelectric conversion device could be fabricated without heating the device locally. Since the output terminals were mounted on the rear surface of the substrate, the output was supplied to the outside within the area of the device. The area of the surrounding portions used for taking out the output could be reduced.

Figure 10:
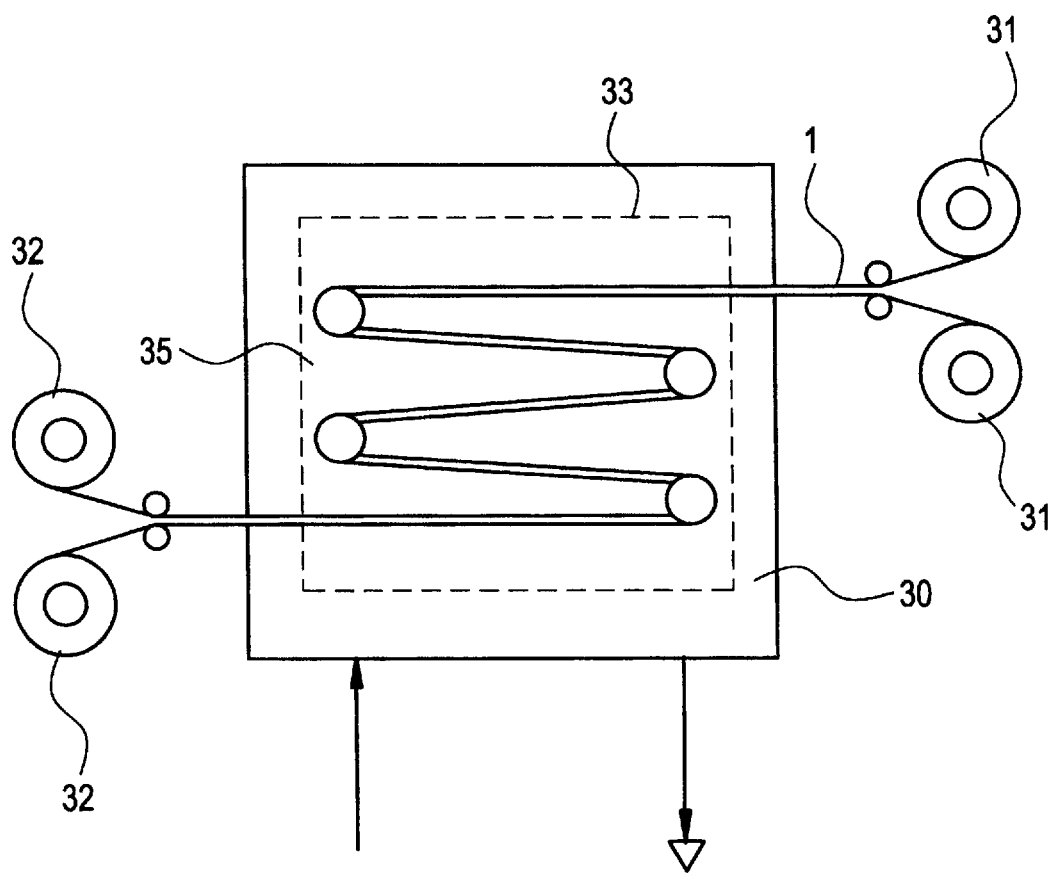
FIG. 10 illustrates another plasma processing method according to the invention.

The photoelectric conversion layer 3 can also be formed by the roll-to-roll method. In particular, three plasma processing machines similar to the machine shown in FIG. 10 are used. These machines are connected in turn to form a P-type semiconductor layer, an intrinsic semiconductor layer, and an N-type semiconductor layer, respectively. In this way, the photoelectric conversion layer 3 is formed.

Example 2

Figure 1B:
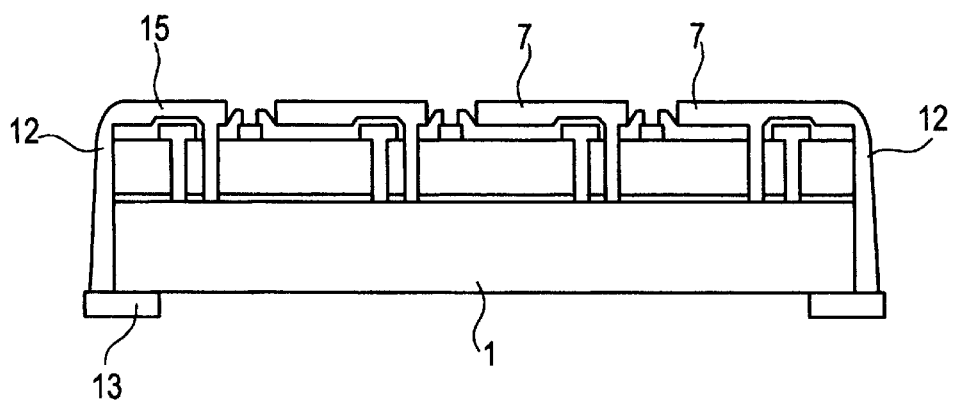

This example of photoelectric conversion device takes a form as illustrated in FIG. 1(B). In this structure, connector portions 12 used to connect the second electrodes 7 with output terminals 13 located on the rear surface of the substrate are formed at the end surfaces of the substrate. Other manufacturing steps are similar to the corresponding steps of Example 1 but the laser illumination steps for piercing the substrate is dispensed with.

Since the end surfaces of the substrate are used as the connector portions 12, the output terminals 13 are adhesively bonded to the rear surface of the substrate so as to protrude from the substrate. This example yields the same advantages as Example 1 but is able to reduce the number of manufacturing steps. Unlike Example 1, the connector portions 12 do not have limited size. Therefore, the reliability of connection and the production yield can be improved further.

Example 3

Figure 1C:
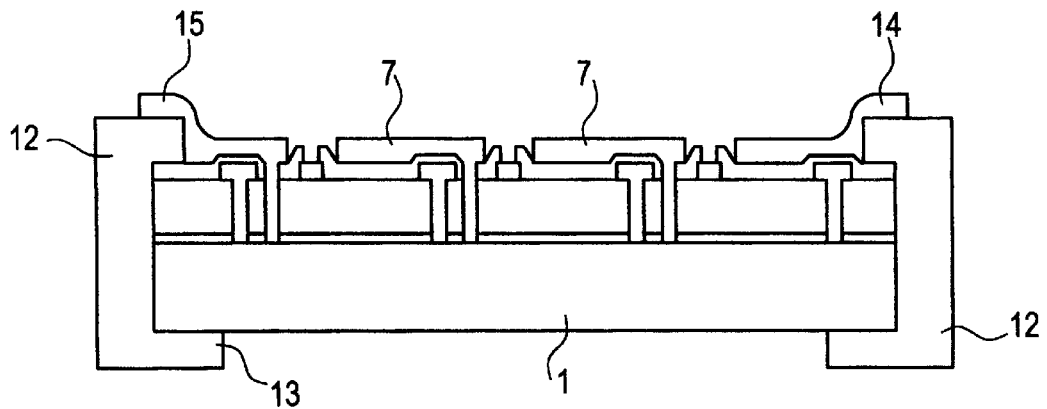

This example of photoelectric conversion device takes a form as illustrated in FIG. 1(C). In this structure, connector portions 12 used to connect the second electrodes 7 with output terminals 13 located on the rear surface of the substrate are formed on the end surfaces of the substrate. Unlike Example 2, the connector portions 12 are not made of the same material as the second electrodes 7. Rather, the connector portions 12 are made of the same material as the output terminals 13 formed on the rear surface of the substrate. These connector portions 12 made of a metal are located on opposite sides of the substrate and clamp it therebetween. Other manufacturing steps are similar to the corresponding steps of Example 1 but the laser illumination step for piercing the substrate is dispensed with.

Each metal clamp acting as one connector portion 12 and also as one output terminal 13 takes a U-shaped form with respect to the cross section of the photoelectric conversion device. Hence, the metal clamps are more firmly mounted to the substrate. Of course, an adhesive may also be used to bond the clamps with the substrate if necessary.

If the clamps simply clamp the substrate therebetween, then the electrical connection with the second electrode 6 is not satisfactory. Therefore, the second electrodes 7, or auxiliary electrodes, are made to extend to the surfaces of the clamps so that the clamps are connected with the second electrodes 6 and 7. In this way, satisfactory connection can be made.

In the structure of this example, not only the rear surface of the substrate but also the end surfaces of the substrate are used to take out the output. This facilitates mounting this photoelectric conversion device into a product with the device used as an auxiliary power supply.

In the three examples described thus far, photoelectric conversion devices having a given integrated structure has been described. The invention is not limited to this integrated structure. Of course, the invention can be applied to other structures.

Example 4

Figure 8:
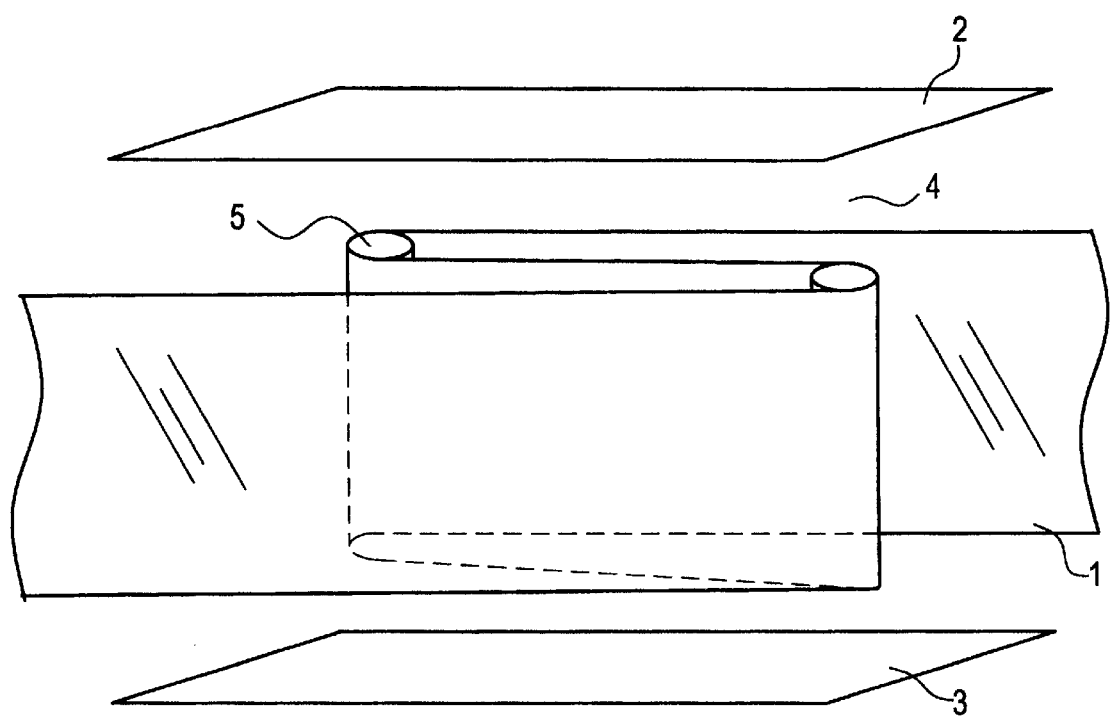
FIG. 8 illustrates a plasma processing method according to the invention.
Figure 9:
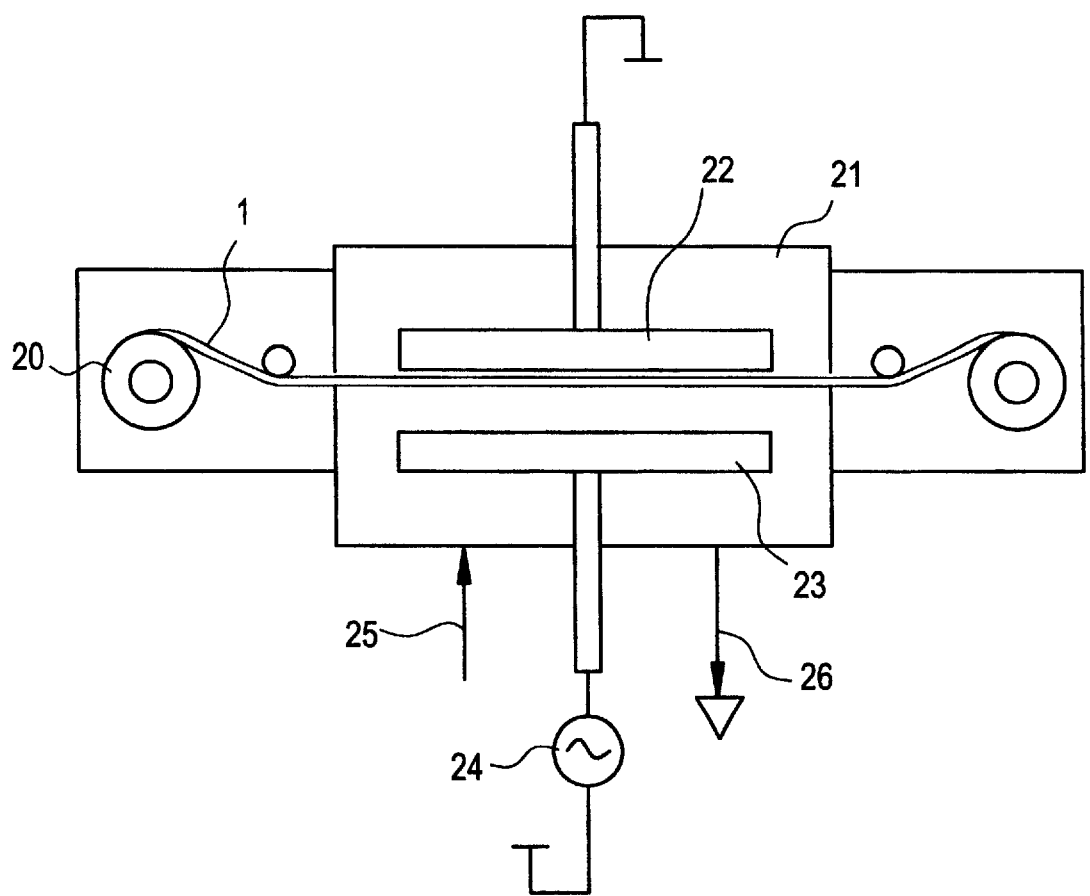
FIG. 9 illustrates a known plasma processing method.

FIG. 10 schematically shows the reaction chamber of a machine and its vicinity, the machine embodying a method of processing a substrate in accordance with the present invention. Two rolls of PET film having a thickness of 200 μm and a width of 200 mm are used as flexible substrates 201. These two rolls are continuously supplied into the reaction chamber, 230, while held in a back-to-back relation. The substrates 201 taking the form of rolls 231 are positioned in a back-to-back relationship to each other. These rolls 231 are held by rollers and made to take a zigzag course such that each substrate passes a discharge region 235 between a pair of electrodes 233 and 234 five times. In the present example, the electrodes and the substrates are arranged as shown in FIG. 8 and so the electrodes 233 and 234 are parallel to the plane of the drawing. Since these electrodes cannot be shown, their positions are schematically indicated by a broken line. The time for which one substrate stays within the plasma processing region 235 can be increased fivefold compared with the prior art method. In addition, two substrates are supplied while held in a back-to-back relation and, therefore, the throughput of the whole machine can be increased by a factor of 10.

Where this machine is used to build a solar battery of a non-single crystal semiconductor on a flexible substrate, plural reaction chambers as shown in FIG. 10 are required to be connected together. More specifically, reaction chambers used to form a P-type semiconductor, an I-type semiconductor, and an N-type semiconductor, respectively, are connected in turn. Semiconductor films are formed by continuously supplying a substrate into the spaces between the reaction chambers.

Each reaction chamber is equipped with a reactive gas supply system, a gas discharge system, and a substrate-heating means. The P-type, I-type, and N-type semiconductors differ in thickness. However, the speed at which the substrate is conveyed cannot be made different among the reaction chambers, because the substrate is supplied continuously. Therefore, the length of the substrate existing in each different plasma processing region is made different so that the substrate may stay in each different plasma processing region of the reaction chambers for a different time. In consequence, films having different thicknesses can be realized at a constant conveyance speed without making the reaction chambers different in length.

Example 5

Figure 11:
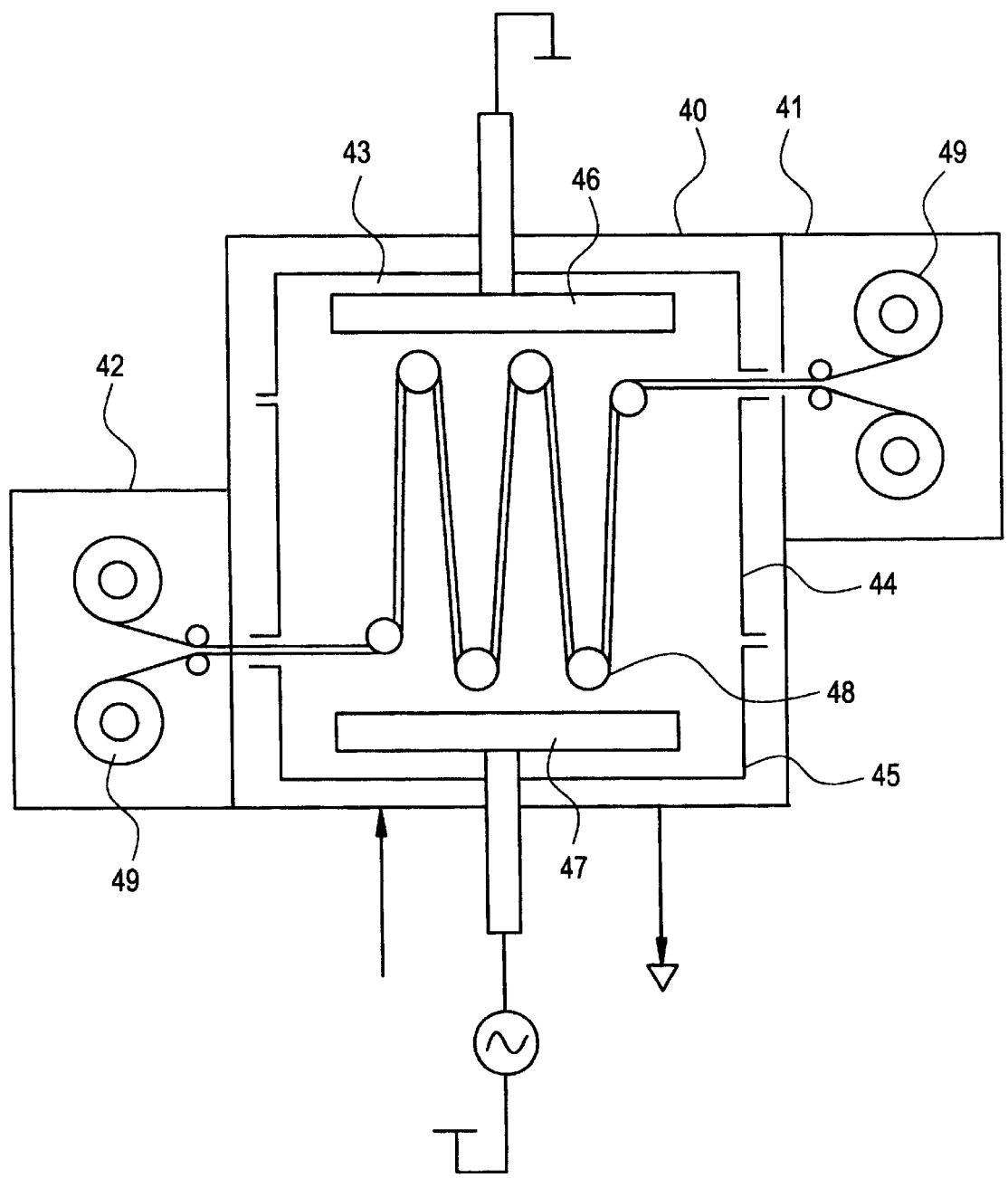
FIG. 11 illustrates a further plasma processing method according to the invention.

FIG. 11 shows another machine which is similar to the machine already described in connection with FIG. 10 with respect to the structure for supplying substrates but differs in the following points. Rolls 249 for supplying substrates are mounted adjacent to a reaction chamber and inside a substrate supply chamber 241 which is shielded from the outside so as to have the same pressure or ambient as the inside of the reaction chamber. Similarly, rolls 249 for winding up the substrates are mounted adjacent to the reaction chamber and inside a substrate take-up chamber 242 which is shielded from the outside so as to have the same pressure or ambient as the inside of the reaction chamber.

The substrates 201 make plural turns between electrodes 246 and 247 to cause the substrates to stay for a long time, in the same way as in Example 4. The discharge space in the plasma processing region where the substrates stay is confined by electrode hoods 243, 245 mounted at the back of the electrode pair and also by a frame 244 having slits permitting passage of the substrates. A plasma is confined within this limited space.

The ambient of the plasma can be made uniform by fabricating the electrode hoods and the frame out of the same material or by putting them at the same potential. In consequence, a homogeneous plasma discharge can be accomplished. As a result, substrates can be uniformly treated with a plasma, or uniform films can be formed on the substrates. Also, even if the electrode spacing is increased, the ambient of the plasma can be made uniform. This enables a stable plasma discharge, thus increasing the time for which the substrates stay.

Figure 12:
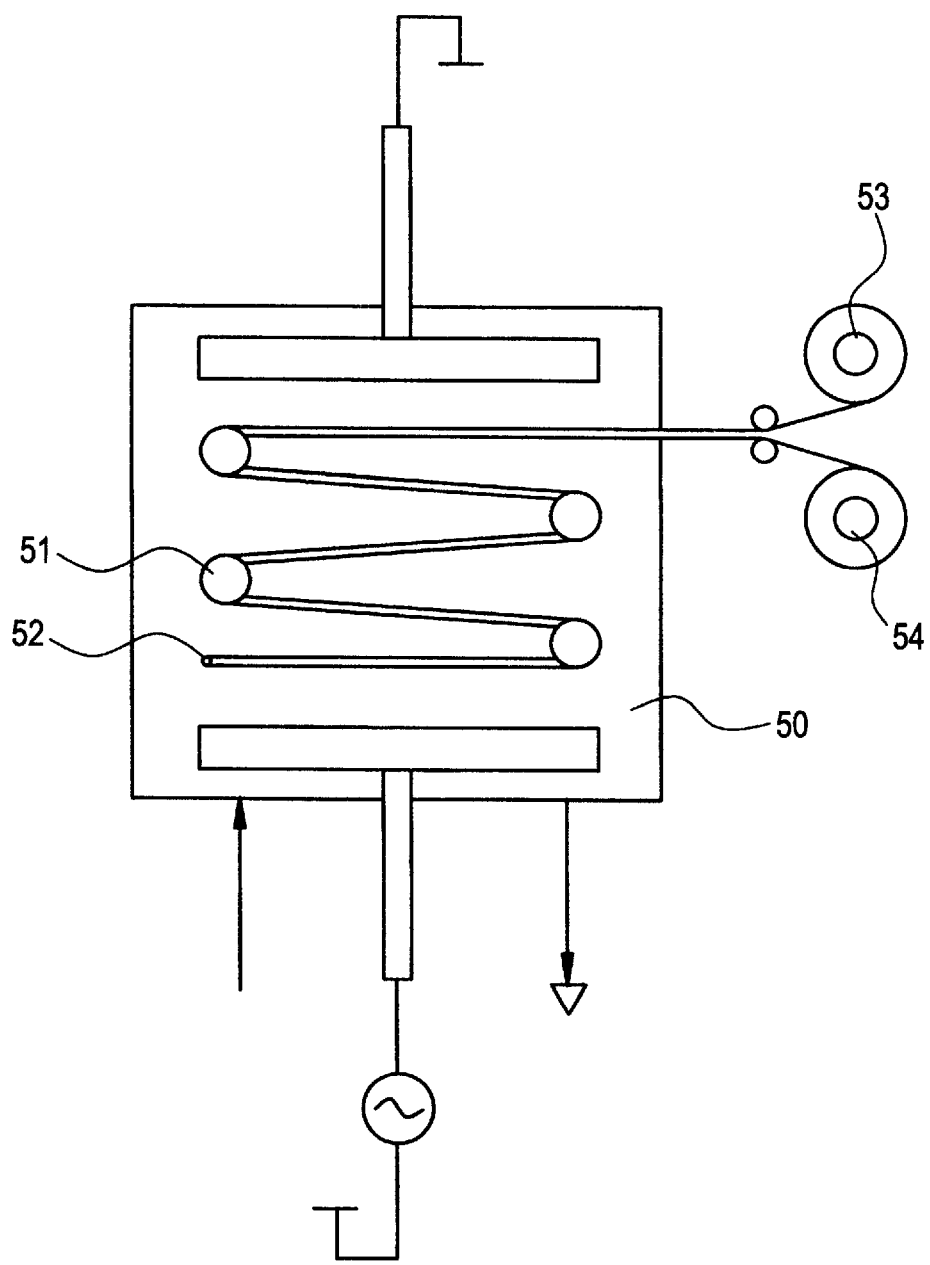
FIG. 12 illustrates a yet other plasma processing method according to the invention.

In the examples described above, substrates are supplied from one side and wound up on the other side to cause them to stay for a long time in a plasma processing region. The present invention is not limited to this structure. An alternative structure is shown in FIG. 12, where substrates are supplied from one side, turned back inside the plasma processing region, and wound up on the same side. Specifically, rolls 251 for a zigzag movement and rolls 251 for turning back the substrates therearound are mounted in the plasma in a reaction chamber 250. The substrates are conveyed in a back-to-back relation in alternate directions.

As shown in FIGS. 10 and 11, a plasma processing method in accordance with the present invention comprises the steps of:

generating a plasma in a reaction chamber;

extending a substrate across said chamber to expose a surface of said substrate to said plasma; and treating said substrate with said plasma, wherein a passage of said substrate is bended at least one point within said plasma in order that an effective area of said substrate treated with said plasma is increased.

Said plasma can be formed between a pair of electrodes. Said substrate is continuously moved through said chamber during said treating.

In the structures shown in FIGS. 10 and 11, plural reactions can be easily carried out successively by connecting together plural reaction chambers. In the structure shown in FIG. 12, each substrate always passes through the same ambient twice and, therefore, even if the distribution of plasma discharge is not uniform, the substrate undergoes uniform processing.

Any of these structures is a substrate supply system which improves the throughput of plasma processing. These structures can be appropriately selected, depending on the form and nature of the required plasma processing.

The present invention makes it possible to form output terminals on a flexible substrate having poor thermal resistance with good bonding strength and sufficient electrical connectivity without soldering. In this way, a photoelectric conversion device comprising a substrate free of distortion and warpage can be realized. Furthermore, the present invention enables plasma processing which utilizes a high-productivity roll-to-roll method without the need to increase the dimensions of the machine or to decrease the speed at which the substrate or substrates are conveyed.

What is claimed is:

1. A photoelectric conversion device comprising:
    a common substrate having a front surface and a rear surface;
    a plurality of series connected photovoltaic elements integrated on said common substrate, each of said photovoltaic elements comprising:
    a first electrode directly formed on the front surface of said common substrate;
    a photoelectric conversion semiconductor layer provided on said first electrode; and
    a second electrode formed on said photoelectric conversion semiconductor layer;
    an output terminal provided on the rear surface of said substrate; and
    a conductor connecting said output terminal with the second electrode of one of the photovoltaic elements through at least said common substrate and said photoelectric conversion semiconductor layer.

2. The photoelectric conversion device of claim 1 wherein said substrate comprises an organic material.

3. The photoelectric conversion device of claim 1 wherein said photoelectric conversion semiconductor layer has a PIN junction.

4. A photoelectric conversion device comprising:
    an organic resin substrate having a front surface and a rear surface, said substrate having at least one contact hole opened therethrough;
    a first electrode formed on said front surface;
    a photoelectric conversion semiconductor layer provided on said first electrode;
    a second electrode formed on said photoelectric conversion semiconductor layer;
    an output terminal provided on the rear surface of said substrate; and
    a conductive layer formed on said second electrode and extending at least through the hole of the substrate and through a hole of said photoelectric conversion semiconductor layer to contact said output terminal, thereby, electrically connecting said output terminal with said second electrode.

5. The device of claim 4 wherein said substrate is flexible.

6. The photoelectric conversion device of claim 4 wherein said photoelectric conversion semiconductor layer has a PIN junction.

7. A photovoltaic cell comprising:
    an insulating substrate having a front surface and a rear surface;
    a first conductive film formed on the front surface of said substrate;
    a photoelectric conversion layer formed on said first conductive film;
    a first groove formed through said photoelectric conversion layer and said first conductive film in order to electrically divide said first conductive film and said photoelectric conversion layer;
    a first insulating strip filling said first groove;
    an opening formed through said photoelectric conversion layer and reaching to said first conductive film;
    a second conductive film formed on said photoelectric conversion layer and covering said first insulating strip;
    a conductive material filled in said opening to connect said first conductive film and said second conductive film;
    a second groove formed through said second conductive film in order to electrically divide said second conductive film, said opening being located between said first groove and said second groove;
    an output terminal provided on the rear surface of said substrate; and
    a conductor connecting said output terminal and said second conductive film,
    wherein said conductor is connected to said output terminal through a hole formed through at least said semiconductor layer and said substrate.

8. A photoelectric conversion cell comprising:
    an insulating substrate having a front surface and a rear surface;

a first conductive film formed on the front surface of said substrate;

a photoelectric conversion semiconductor layer formed on said first conductive film;

a second conductive film formed on said photoelectric conversion semiconductor layer;

first and second insulators formed through at least said photoelectric conversion layer with a photoelectric conversion element defined therebetween;

an output terminal formed on the rear surface of said substrate; and a conductive layer formed on the second conductive film and electrically connecting said second conductive film and said output terminal through a hole opened through at least said photoelectric conversion semiconductor layer and said substrate, wherein the hole of said photoelectric conversion semiconductor layer is located outside said photoelectric conversion element.

9. A photoelectric conversion device according to claim 8 wherein said first electrode is directly formed on said front surface of the substrate.

10. A photoelectric conversion device according to claim 8 wherein said substrate is flexible.

11. A photoelectric conversion device according to claim 8 wherein said photoelectric conversion semiconductor layer comprises silicon.

12. A photoelectric conversion device according to claim 8 wherein said conductive layer extends through said hole.

13. A photoelectric conversion device according to claim 8 wherein said hole is opened through said first and second conductive layers.

* * * * *